(12) United States Patent
Donlin (10) Patent No.: US 7,873,931 B1
(45) Date of Patent: Jan. 18, 2011

(54) CONGESTION-BASED ROUTING WITH RECONFIGURABLE CROSS-POINTS FOR DENSE SIGNAL TAPPING

(75) Inventor: Adam P. Donlin, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 396 days.

(21) Appl. No.: 12/053,059

(22) Filed: Mar. 21, 2008

(51) Int. Cl.
*G06F 17/50* (2006.01)

(52) U.S. Cl. ............... 716/14; 716/4; 716/8; 716/9; 716/10

(58) Field of Classification Search ............ 716/4, 716/8, 9, 10, 14, 16, 17
See application file for complete search history.

(56) References Cited

U.S. PATENT DOCUMENTS

| | | | |
|---|---|---|---|
| 7,757,196 B2 * | 7/2010 | Bird et al. ............... | 716/12 |
| 7,797,663 B2 * | 9/2010 | Bird et al. ............... | 716/15 |
| 2008/0245556 A1 * | 10/2008 | Bird et al. ............... | 174/262 |
| 2008/0245557 A1 * | 10/2008 | Bird et al. ............... | 174/262 |
| 2008/0250373 A1 * | 10/2008 | Bird et al. ............... | 716/7 |
| 2008/0250377 A1 * | 10/2008 | Bird et al. ............... | 716/15 |

OTHER PUBLICATIONS

Betz, V. and Rose, J., "VPR: A New Packing, Placement and Routing Tool for FPGA Research", 1997 International Workshop on FPGAs, London, UK, FPL's1997, Sep. 1-2, 1997, pp. 213-222.
McMurchie, L. and Ebeling,C., "Pathfinder: A negotiation -based performance driven router for FPGAS," Proceedings of $3^{rd}$ International ACM Symposium on FPGA's (FPGA'95), Feb. 12-14, 1995, pp. 111-117, Monterey, California, USA.

* cited by examiner

*Primary Examiner*—Sun J Lin
(74) *Attorney, Agent, or Firm*—Kevin T. Cuenot; Thomas George (57) ABSTRACT

A computer-implemented method of incorporating probe points within a circuit design for implementation within an integrated circuit device can include routing probe nets of the circuit design in an overlap mode, identifying a plurality of probe net routes including a common overlapping portion, and including a switch at each location within the circuit design where at least two probe net routes of the plurality of probe net routes diverge from a common point. The circuit design can be output.

20 Claims, 4 Drawing Sheets

CONGESTION-BASED ROUTING WITH RECONFIGURABLE CROSS-POINTS FOR DENSE SIGNAL TAPPING

FIELD OF THE INVENTION

The embodiments disclosed herein relate to debugging circuit designs for an integrated circuit device (IC). More particularly, the embodiments relate to using a congestion-based router to incorporate probe points into a circuit design for an IC.

BACKGROUND

Circuit designs can be debugged in a number of different ways. One way is to simulate a circuit design within a register transfer level (RTL) simulator. An RTL simulator provides a high degree of visibility into the circuit design. Typically, the behavior of nearly any circuit element and/or signal may be observed. RTL simulators, however, operate at slow simulation speeds. That is, the speed at which simulation of the circuit design is performed is typically much slower than the speed at which the physical circuit would operate once implemented within an integrated circuit device (IC).

Another type of debugging technique involves including one or more probe points within a circuit design. The circuit design can be processed (e.g., placed and routed), and implemented within an IC (e.g., within a programmable IC such as a programmable logic device). The probe points are then implemented at specified locations within the IC and embedded in the device under test (DUT), e.g., the circuit design. The probe points can sample information from within the DUT and provide that information to a memory, a controller, or to a location or component off-chip. A benefit of this technique is that the IC runs at full speed.

When testing speed is increased, however, visibility into the DUT decreases. Each probe point requires resources of the IC that, once used by a probe point, are unavailable for use by the circuit design. Further, a signal path must be established for each probe point. This requires routing resources. Any routing resources used by a probe point also are unavailable for use by the circuit design. Effectively, the probe points compete with the DUT for resources of the IC. This typically limits the number of probe points that may be used.

In view of the complexity of modern circuit designs and the limited availability of probe points, it is unlikely that a probe point will be located at each location within the DUT that is desirable. Typically, as more information is gathered to identify the source of a circuit error, it becomes necessary to move one or more probe points to another location within the DUT, e.g., closer to the source of the error, to obtain more useful information. In most cases, moving a probe point requires that the circuit design undergo full placement and routing. This can take a significant amount of time.

In other cases, probe points may be moved and routes modified without full placement and routing. In such cases, care must be taken when re-routing signals so as not to disturb high frequency signals or other areas in which logic is densely packed.

SUMMARY

The embodiments disclosed herein relate to debugging circuit designs for an integrated circuit device (IC) and using a congestion-based routing technique to incorporate probe points into a circuit design for an IC. One embodiment of the present invention can include a computer-implemented method of incorporating probe points within a circuit design for implementation within an IC. The method can include routing probe nets of the circuit design in an overlap mode, identifying a plurality of probe net routes including a common overlapping portion, and including a switch at each location within the circuit design where at least two probe net routes of the plurality of probe net routes diverge from a common point. The circuit design can be output.

Each probe net route can include a probe point as an endpoint. The method can include configuring at least one switch to establish an uninterrupted signal path for a selected one of the plurality of probe net routes, thereby enabling the probe point of the selected probe net route. A type of switch to be included within the circuit design can be selected according to a timing requirement of the plurality of probe net routes and/or a switching requirement of the plurality of probe net routes, for example.

The method also can include distinguishing between probe nets and circuit nets of the circuit design, routing the circuit nets with overlap permitted, and removing all instances of overlap from the circuit net routes. Overlap may be permitted to remain within probe net routes.

Each probe net route can correspond to a probe point. The method can include loading the IC with the circuit design and selectively enabling different probe points of the plurality of probe net routes by reprogramming at least one switch to establish an uninterrupted signal path for a selected one of the plurality of probe net routes, thereby enabling the probe point corresponding to the selected probe net route. Selectively enabling different probe points can include reconfiguring the IC.

The method also can include loading the IC with the circuit design and programming at least one switch to establish an uninterrupted signal path for a selected one of the plurality of probe net routes, thereby enabling the probe point corresponding to the selected probe net route. At least one switch can be reprogrammed to establish an uninterrupted signal path for a different one of the plurality of probe net routes, thereby enabling the probe point corresponding to the different probe net route.

Another embodiment of the present invention can include a computer-implemented method of incorporating probe points within a circuit design to be implemented within an IC. The method can include distinguishing between circuit nets and probe nets of the circuit design, determining routes for probe nets in an overlap mode that allows routing resources to be allocated to more than one probe net, and selecting a plurality of probe net routes including at least one common routing resource. A switch can be included within the circuit design at each location where at least one route of the plurality of probe net routes diverges from at least one other route of the plurality of probe net routes. Each switch can selectively establish a connection to one of the diverging probe net routes. The circuit design can be output.

The method can include selecting a type of switch to be included in the circuit design according to a timing requirement of the selected plurality of probe net routes and/or a switching requirement of the selected plurality of probe net routes, for example.

The method can include initially routing the circuit nets in the overlap mode and removing all instances of overlap from the circuit net routes.

Each probe net route can correspond to a probe point. The method further can include loading the IC with the circuit design and selectively enabling different probe points of the plurality of probe net routes by reprogramming at least one switch to establish an uninterrupted signal path for a selected one of the plurality of probe net routes, thereby enabling the probe point corresponding to the selected probe net route. Reprogramming at least one switch can include reconfiguring the IC.

The method also can include loading the IC with the circuit design and programming at least one switch to establish an uninterrupted signal path for a selected one of the plurality of probe net routes, thereby enabling the probe point corresponding to the selected probe net route. One or more switches can be reprogrammed to establish an uninterrupted signal path of a different one of the plurality of probe net routes, thereby enabling the probe point corresponding to the different probe net route.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed herein relate to debugging circuit designs for an integrated circuit device (IC). In accordance with the embodiments disclosed herein, a plurality of probe points can be included within a circuit design. The circuit design, which specifies the probe points, can be processed, e.g., placed and routed. The circuit design can be routed using a congestion-based router. Such a router generally allows for more than one net of the circuit design to be assigned or mapped to one or more same physical routing resources of the IC. Thus, both circuit nets and probe nets may be routed in a manner that allows overlapping. Overlaps may be removed from the circuit net routes, but allowed to remain, at least to a limited degree, with respect to probe net routes.

Thus, two or more probe nets may be mapped to the same routing resources. Any probe points connected to a probe net that has some portion of that probe net assigned to the same routing resource as another portion of a different probe net can be considered a probe group. Switches, or cross-points, can be inserted into the probe net routes to allow selection of one probe point over another within the same probe group. By configuring the switches so that only one probe point of a probe group is active, or enabled, at any given time, an increased number of probe points may be included in the circuit design while keeping usage of routing resources low. Further, different probe points may be selected and enabled without having to place and route the circuit design again, and without having to re-route selected signals.

Figure 1:
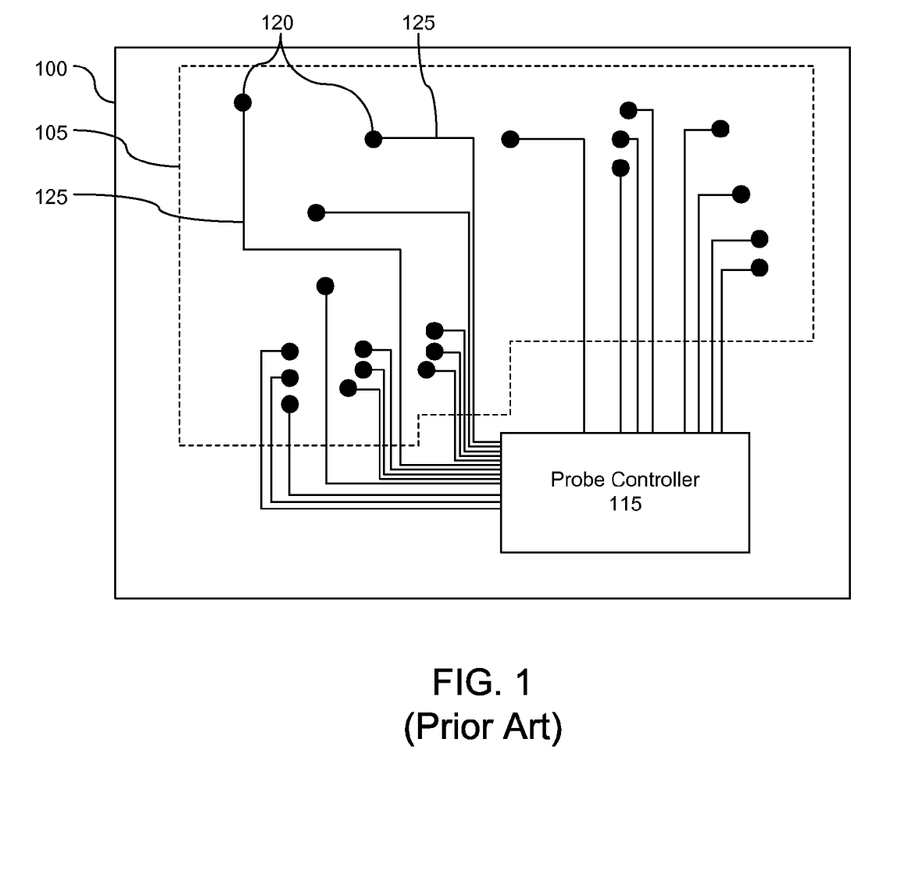
FIG. 1 is a block diagram illustrating an integrated circuit device (IC) including a device under test (DUT), which is useful for understanding the embodiments disclosed herein.

FIG. 1 is a block diagram illustrating an IC 100 including a device under test (DUT) 105 which is useful for understanding the embodiments disclosed herein. The IC 100 can be a programmable logic device (PLD), for example, or some other type of programmable IC. PLDs are a well-known type of IC that can be programmed to perform specified logic functions.

For example, IC 100 may be a field programmable gate array (FPGA) that includes an array of programmable tiles which may include both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

Other types of PLDs may include Complex Programmable Logic Devices, or CPLDs, mask programmable devices, or the like. The terms "PLD" and "programmable logic device" can include, but are not limited to, these exemplary devices, as well as encompassing devices that are only partially programmable. An appreciation of the present invention is presented by way of specific examples utilizing PLDs such as field programmable gate arrays (FPGAs). However, the present invention is not limited by these examples.

The DUT 105 represents a circuit design that has been placed, routed, and loaded into IC 100. As shown, IC 100 also may include a probe controller 115 to which each of probe points 120 may be connected. The probe controller 115 may be implemented using programmable logic of the IC 100, a dedicated processor, or other circuitry. In general, the probe controller 115 can function as an interface, memory, and/or collection point for sampled data acquired from each of the probe points 120. The probe controller 115 further can make information collected by the probe points 120 available to other systems "off-chip."

Each of the probe points 120 can be connected to the probe controller 115 via a probe net route 125. That is, each probe point 120 can be coupled to the probe controller 115 via a unique route comprising enumerated routing resources of the IC 100. No routing resources are shared from one probe net route to another probe net route in this known configuration of IC 100.

Thus, as the number of probe points 120 increases within the DUT 105, the number of probe net routes 125 also increases, e.g., one route for each probe point. Any resources of IC 100 that are used by a probe point are not available for use by the DUT 105. The same is true with respect to probe net routes 125. That is, any routing resources of IC 100 used by a probe net route 125 are not available for use by the DUT 105. The more routing resources utilized for connecting probe points 120 with the probe controller 115, the fewer routing resources, e.g., wires, available for use by the DUT 105.

It should be appreciated that the term "net," as used herein, refers to a logical connection as may be specified within a circuit design. The term "route" and the phrase "routing resource," as used herein, refer to physical structures, e.g., wires and switches, on the IC 100 that are used to implement a given net specified in a circuit design. That is, nets are assigned or mapped to one or more routing resources, e.g., routed, to physically implement the net within the IC.

Figure 2:
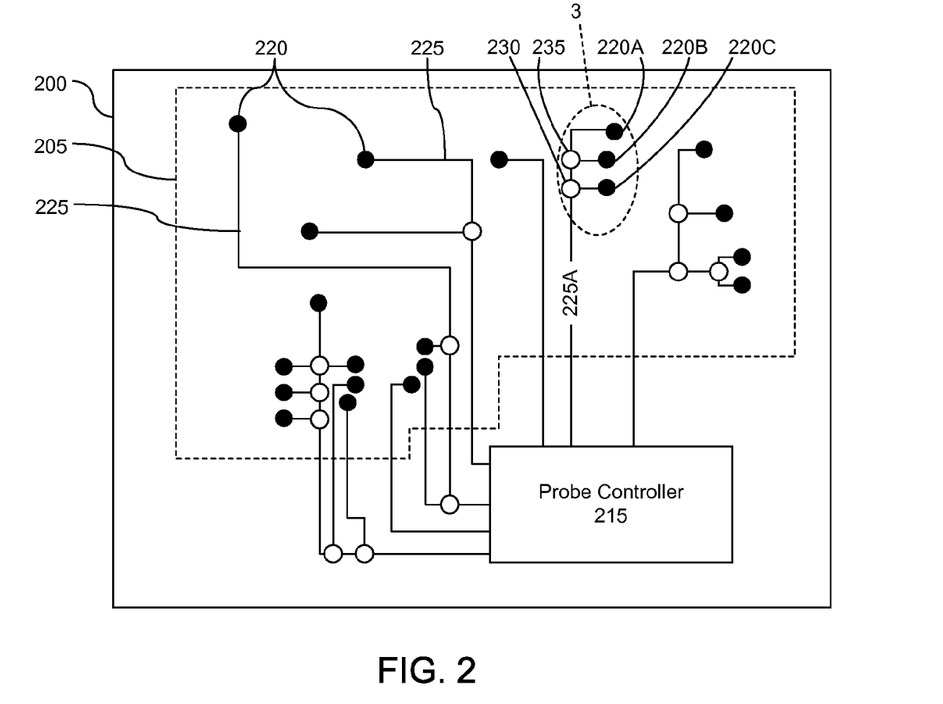
FIG. 2 is a second block diagram illustrating an IC including a DUT in accordance with one embodiment of the present invention.

FIG. 2 is a second block diagram illustrating an IC 200 including a DUT 205 in accordance with one embodiment of the present invention. The IC 200 can include a probe controller 215 which can provide similar functionality as the probe controller discussed with reference to FIG. 1. The DUT 205 can include a plurality of probe points 220 and probe net routes 225 coupling the probe points 220 to the probe controller 215.

The DUT 205 represents a circuit design that specifies various logic functions, circuit nets, probe points, and probe nets. The circuit design that implements DUT 205 has been placed. Further, the circuit design has been routed using a congestion-based router. In general, a congestion-based router can map nets so that a given routing resource, e.g., a wire, may be assigned to more than one net. This means that the two nets overlap one another with respect to any shared routing resources.

Typically, overlaps are eliminated from the circuit design as the routing task progresses. As a given routing resource is used by more routes, the competition for that routing resource increases. As a result, the cost of using the routing resource within a given route also increases. Eventually, only the most critical routes can use, or afford, the cost of such "in-demand" routing resources. Overlaps generally are considered infeasible or illegal circuit conditions, as two signals cannot occupy a given wire at the same time. Accordingly, those routes or connections that are not critical can utilize alternative routing resources and/or routes. Thus, in general, a congestion router implements a process where multiple circuit nets are temporarily allocated to the same routing resources. The allocation of nets to routing resources is then refined until a one-to-one mapping results.

In accordance with the embodiments disclosed herein, congestion-based routing can be applied to probe nets. However, rather than removing all instances of overlap from probe net routes, as in known processes, overlapping probe net routes may be allowed to remain in the routed design. Overlap in circuit net routes still may be removed.

In illustration, probe points 220A, 220B, and 220C are each coupled to a probe net that has been assigned to routing resource 225A. That is, each probe net of probe points 220A, 220B, and 220C has been routed, e.g., has a route, that shares routing resource 225A. Thus, probe points 220A, 220B, and 220C can be said to be members of a probe group. Rather than removing the overlap condition, the overlap may be allowed to persist.

Switches 230 and 235 may be added to the circuit design. Switches 230 and 235 can be any of a variety of different types of programmable switches. For example, switches 230 and 235 may be implemented as PIPs, multiplexers, or any combination of programmable logic. In another example, a logic-level multiplexer can be used as a switch. A logic level multiplexer refers to a multiplexer that is implemented within soft logic of programmable IC, for example using a look-up table. By configuring switches 230 and 235 appropriately, a connection can be established between the probe controller 215 and any one of probe points 220A, 220B, or 220C of the probe group. The probe points 220A, 220B, and 220C of the same probe group can be mutually exclusive in that only one will be enabled at any given time. By allowing only one probe point of the probe group to be coupled to the probe controller 215 at any one time, the potential for an illegal condition is removed. For example, with this condition in mind, only one signal from one of probe points 220A, 220B, and 220C would occupy wire 225A at any given time.

Figure 3:
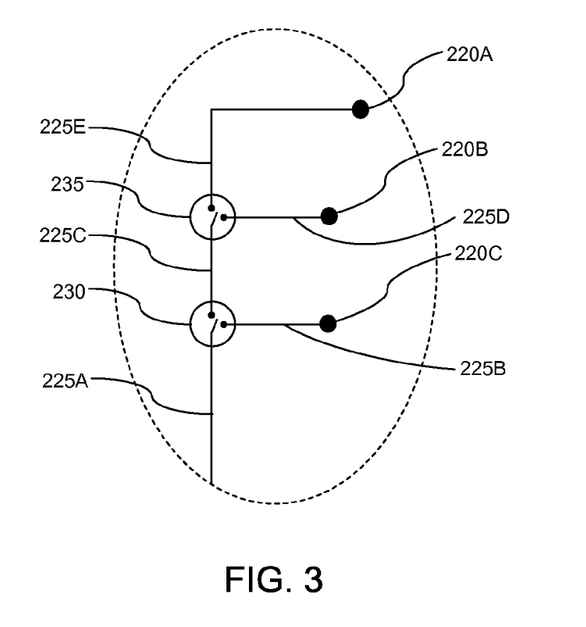
FIG. 3 is a more detailed view of a portion of the DUT illustrated in FIG. 2.

FIG. 3 is a more detailed view of a portion of the DUT illustrated in FIG. 2. FIG. 3 presents a more detailed view of probe points 220A, 220B, and 220C, along with switches 230 and 235. As shown, routing resource 225A is shared among each route of probe points 220A, 220B, and 220C of the probe group. That is, in order for each of probe points 220A-220C to communicate with the probe controller, each must utilize routing resource 225A, albeit not at the same time.

In order for probe point 220A to be active, or enabled, an uninterrupted signal path between the probe controller and probe point 220A must be established. Accordingly, switch 230 can be adjusted to couple routing resources 225A and 225C. Switch 235 can be adjusted to couple routing resources 225C and 225E. By configuring switches 230 and 235 as described, routing resources 225B and 225D will not be connected into the circuit of the DUT. Accordingly, probe points 220B and 220C have no signal path to the probe controller and will be unable to communicate with the probe controller.

In order for probe point 220B to be active, or enabled, an uninterrupted signal path between the probe controller and probe point 220B must be established. Accordingly, switch 235 can be adjusted to couple routing resources 225D with 225C. Switch 230 can be adjusted to couple routing resources 225C and 225A. Routing resources 225B and 225E will not be connected into the circuit of the DUT. Accordingly, probe points 220A and 220C will not be communicatively linked with the controller and, therefore, will be unable to communicate with the probe controller.

Finally, for probe point 220C to be active, or enabled, switch 230 can be adjusted to couple routing resource 225A with routing resource 225B. The setting for switch 235 becomes irrelevant, as neither probe point 220B nor probe point 220A will have a signal path to the probe controller. Therefore, both will be unable to communicate with the probe controller.

Switches 230 and 235 can be selectively reconfigured or reprogrammed a number of different ways. In one embodiment, the switches can be reconfigured by loading and/or reloading the IC with an appropriate bitstream that specifies the particular switch configuration that is desired. In another embodiment, the switches may be dynamically configured during operation of the IC, for example, using dynamic partial reconfiguration. Accordingly, the term "reconfiguring" the IC, as used herein, can mean, for example, fully reloading the IC, partially reloading the IC when off-line, or partially reloading the IC during operation.

Figure 4:
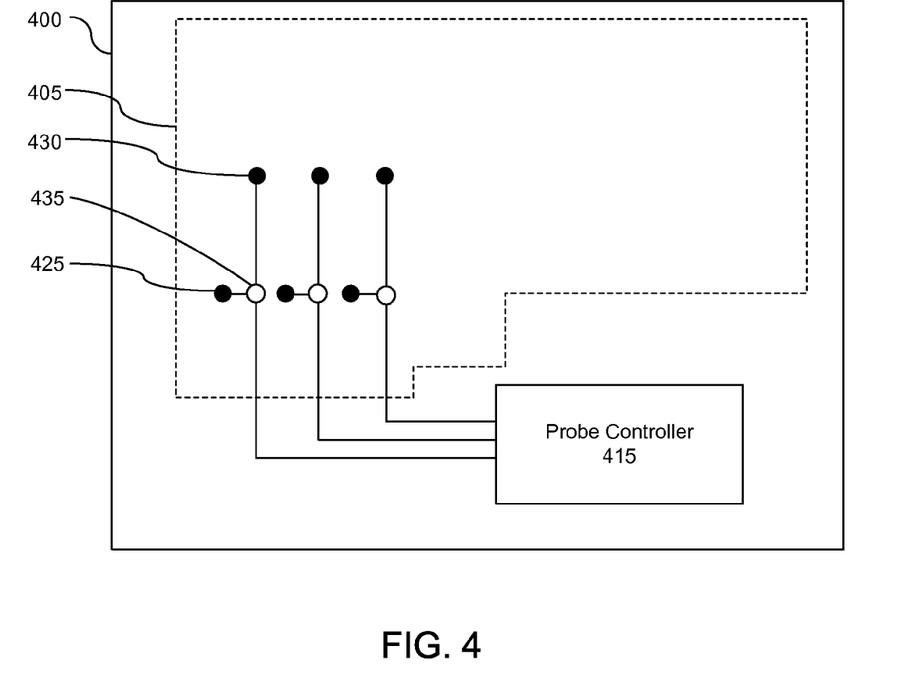
FIG. 4 is a third block diagram illustrating an IC including a DUT in accordance with another embodiment of the present invention.

FIG. 4 is a third block diagram illustrating an IC 400 including a DUT 405 in accordance with another embodiment of the present invention. FIG. 4 illustrates an embodiment in which probe points can be located within the DUT 405 with increasing depth or at different levels. For example, probe point 425 and probe point 430 can be part of a same probe group in that only one may be active at any given time according to the configuration of switch 435. That is, switch 435 can be configured to connect either probe point 425 or probe point 430 to the probe controller 415 at any given time.

Accordingly, the location in the DUT 405 corresponding to probe point 425 may be sampled when switch 435 is in a first configuration. By reconfiguring switch 435, the location corresponding to probe point 430 may be sampled. Probe point 430 can be said to be "deeper" within the DUT 405, as probe point 430 lies further along a common path. By organizing probe points in this manner, considerable probe point coverage of the DUT 405 may be achieved.

Figure 5:
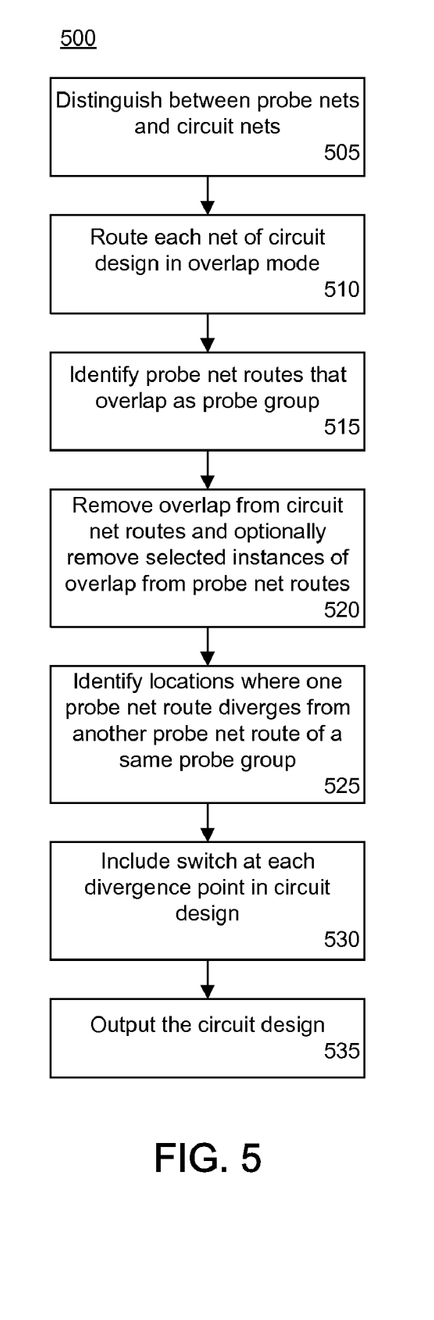
FIG. 5 is a flow chart illustrating a method of incorporating probe points within a circuit design in accordance with another embodiment of the present invention.

FIG. 5 is a flow chart illustrating a method 500 of incorporating probe points within a circuit design in accordance with another embodiment of the present invention. Method 500 can be performed, for example, by an electronic design automation tool that facilitates circuit design and performs functions such as placement, routing, and generation of a bitstream to be used in programming a target IC. Method 500 can begin in a state where a circuit design, e.g., a netlist or one or more hardware description language files, has been augmented with program code specifying one or more probe points. The circuit design can be placed. Accordingly, the locations of the various user-specified probe points also may be known.

Method 500 can begin in step 505, where probe nets can be distinguished from circuit nets. That is, each probe net can be identified. A probe net can refer to a logical signal connection to be routed between a probe and another circuit component such as a probe controller or other interface. Circuit nets can be identified. Each circuit net can specify a logical signal connection to be routed between a source and one or more loads of the circuit design or DUT. A circuit net can link any node of the circuit design that has not been added for purpose of debugging, e.g., that does not connect to a probe point.

In step 510, each of the nets of the circuit design can be routed in an overlap mode. Overlap mode refers to the operation of a congestion-based router that initially assigns nets of the circuit design to the same routing resources, such that overlap, or sharing of routing resources among two or more nets, occurs. When known methods are used to perform the routing task, instances of overlap generally are removed from all nets in the circuit design based upon various congestion metrics, e.g., competition for desirable or "in-demand" circuit design resources.

In step 515, probe net routes that overlap with one another can be identified. More particularly, each probe net route that includes the same routing resource as another probe net route can be identified. Such probe net routes may be classified as a probe group. Thus, each member of a probe group shares one or more common routing resources with each other member of the same probe group. All distinct probe groups can be identified within the circuit design.

In step 520, instances of overlap can be removed from circuit net routes. In some embodiments, overlap may be allowed and left entirely unchecked within probe net routes. However, in other embodiments one or more instances of overlap may be removed from probe net routes. In these embodiments, instances of overlap may be removed to facilitate more organized creation of probe groups. For example, if a limit is established as to the number of probe points in a probe group, instances of overlap may be removed from probe net routes when the removal of such overlap serves to reduce the number of probe points within probe groups to acceptable levels. The removal of an overlap, for instance, may move a probe point from one probe group to another, or create an additional probe group with fewer probe points. The size of a probe group can be constrained for any of a variety of reasons such as, for example, improving the timing properties of signals and/or utilizing a larger number of probe points at any given time. That is, the mutually exclusive nature of probe points within the same group effectively means that the larger the number of probe groups, the larger the number of probe points that may be used concurrently within a given circuit design.

In step 525, locations where one probe net route diverges from another probe net route can be identified. More particularly, with respect to each probe group, the various points, called divergence points, where one or more probe net routes diverge from one or more other probe net routes of the same probe group can be identified. It should be appreciated that as the routing of probe nets is automatically performed, the divergence points, which are effectively byproducts of that process, are automatically selected as well.

In step 530, a switch can be included at each divergence point. That is, programming for a switch can be included in the circuit design that specifies a switch at each divergence point. In one embodiment, the type of switch also may be selected. As noted, different types of switches may be used. For example, the type of switch, e.g., PIP, multiplexer, a logic-level multiplexer, or other circuit structure, may be selected based upon availability of such switches within the circuit design. If, for example, multiplexers are scarce due to high demand by the circuit design, another type of switch may be selected. Such decisions may be made with respect to the entire circuit design, e.g., globally, or with respect to a limited geographic region on the target IC, e.g., locally.

In another embodiment, the type of switch to be included at a divergence point can be selected according to a timing requirement of the plurality of probe nets. Each switch may have timing characteristics that differ from other switches. For example, a probe net route may have a particular timing requirement that can only be met if a particular type of switch is used within the probe net route. Such a switch type may be selected.

In another embodiment, the type of switch to be included at a divergence point can be selected according to a switching requirement of the plurality of probe nets. For example, a given divergence point may need to be able to switch between two, three, or four different possible probe net routes. The type of switch able to perform such a switching function can be selected for inclusion at that divergence point.

In step 535, the resulting circuit design can be output. The circuit design will specify the placed and routed DUT, a plurality of probe points organized into probe groups, and switches that enable a single member of each probe group at any given time. As used herein, "outputting" and/or "output" can mean, for example, writing to a file, writing to a user display or other output device, playing audible notifications, sending or transmitting to another system, exporting, or the like.

In one embodiment, the circuit design can be output as a programmatic circuit description such as a netlist or a collection of one or more hardware description language files. The circuit design further can be output as a bitstream. In either case, the resulting circuit design may be output in multiple versions, where different combinations of probe points are enabled in each different version of the circuit design, despite the particular form in which the circuit design is output.

The steps described with reference to FIG. 5 are provided for purposes of illustration only. Those skilled in the art will appreciate that other variations of method 500 are possible. For example, circuit nets may be routed separately from probe net routes. In that case, instances of overlap still can be removed from circuit nets. Instances of overlap may still be allowed to persist within probe net routes.

Figure 6:
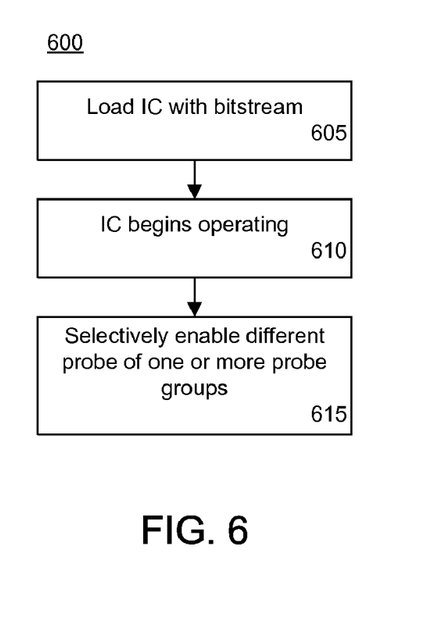
FIG. 6 is a flow chart illustrating a method of selecting probe points for activation within a circuit design in accordance with another embodiment of the present invention.

FIG. 6 is a flow chart illustrating a method of selecting probe points for activation within a circuit design in accordance with another embodiment of the present invention. Method 600 can begin in a state where the circuit design output from FIG. 5 has undergone further processing, e.g., one or more optimizations and conversion to a bitstream. As is known, a bitstream may be loaded into a target IC to program the IC to implement the circuit design, in this case the DUT, specified by the bitstream.

In step 605, the IC can be loaded with the bitstream. The IC will then be programmed to implement the DUT, including the user-specified probe points. Further, the default configuration may specify one probe point of each probe group that is active, e.g., part of the DUT, sampling circuit data, and which is able to communicate that data to a probe controller or other interface.

In step 610, the IC can begin operating. The initially selected probe point of each probe group can begin sampling data and communicating that data back to the probe controller via the probe net route established for each active probe point. In step 615, a different probe point of one or more of the probe groups may be selected and enabled. Step 615 can be dynamically performed during operation of the IC. For example, a technique such as dynamic partial reconfiguration may be used to reconfigure the switches of the various probe groups to select a different probe within one (or more or all) of the probe groups. It should be appreciated, however, that the IC can be reconfigured fully, partially, during operation, or when off-line.

For example, different bitstreams, or portions thereof, may be generated. Each bitstream may specify different ones of the probe points to be enabled. That is, each bitstream may specify different switch configurations for one or more probe groups, thereby selecting a different probe point for such probe groups to be enabled. The IC can be reloaded with a different bitstream depending upon which probe points the circuit design wishes to be active.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of incorporating probe points within a circuit design for implementation within an integrated circuit device, the method comprising:
routing, by a router, probe nets of the circuit design in an overlap mode;
identifying a plurality of probe net routes comprising a common overlapping portion;
including a switch at each location within the circuit design where at least two probe net routes of the plurality of probe net routes diverge from a common point; and
outputting the circuit design.

2. The method of claim 1, wherein:
each probe net route comprises a probe point as an endpoint, and
the method further comprises configuring at least one switch to establish an uninterrupted signal path for a selected one of the plurality of probe net routes, thereby enabling the probe point of the selected probe net route.

3. The method of claim 1, further comprising selecting a type of switch for inclusion in the circuit design according to a timing requirement of the plurality of probe net routes.

4. The method of claim 1, further comprising selecting a type of switch for inclusion in the circuit design according to a switching requirement of the plurality of probe net routes.

5. The method of claim 1, further comprising:
  distinguishing between the probe nets and circuit nets of the circuit design;
  routing the circuit nets forming circuit net routes with overlap permitted; and
  removing all instances of overlap from the circuit net routes, wherein overlap remains within the probe net routes.

6. The method of claim 1, wherein each probe net route corresponds to one of the probe points, and wherein the method further comprises:
  loading the integrated circuit device with the circuit design; and
  selectively enabling different probe points of the plurality of probe net routes by reprogramming at least one switch to establish an uninterrupted signal path for a selected one of the plurality of probe net routes, thereby enabling the probe point corresponding to the selected probe net route.

7. The method of claim 6, wherein the selectively enabling different probe points comprises reconfiguring the integrated circuit device.

8. The method of claim 1, wherein each probe net route corresponds to one of the probe points, and wherein the method further comprises:
  loading the integrated circuit device with the circuit design;
  programming at least one switch to establish an uninterrupted signal path for a selected one of the plurality of probe net routes, thereby enabling the probe point corresponding to the selected probe net route; and
  reprogramming at least one switch to establish an uninterrupted signal path for a different one of the plurality of probe net routes, thereby enabling the probe point corresponding to the different probe net route.

9. A method of incorporating probe points within a circuit design for implementation within an integrated circuit device, the method comprising:
  distinguishing between circuit nets and probe nets of the circuit design;
  determining, by a processor, routes for probe nets in an overlap mode that allows routing resources to be allocated to more than one probe net;
  selecting a plurality of probe net routes comprising at least one common routing resource;
  including a switch within the circuit design at each location where at least one route of the plurality of probe net routes diverges from at least one other route of the plurality of probe net routes, wherein each switch selectively establishes a connection to one of the diverging probe net routes; and
  outputting the circuit design.

10. The method of claim 9, further comprising selecting a type of switch to be included in the circuit design according to a timing requirement of the selected plurality of probe net routes.

11. The method of claim 9, further comprising selecting a type of switch to be included in the circuit design according to a switching requirement of the selected plurality of probe net routes.

12. The method of claim 9, further comprising:
  initially routing the circuit nets forming circuit net routes in the overlap mode; and
  removing all instances of overlap from the circuit net routes.

13. The method of claim 9, wherein each probe net route corresponds to one of the probe points, and wherein the method further comprises:
  loading the integrated circuit device with the circuit design; and
  selectively enabling different probe points of the plurality of probe net routes by reprogramming at least one switch to establish an uninterrupted signal path for a selected one of the plurality of probe net routes, thereby enabling the probe point corresponding to the selected probe net route.

14. The method of claim 13, wherein the reprogramming at least one switch comprises reconfiguring the integrated circuit device.

15. The method of claim 9, wherein each probe net route corresponds to one of the probe points, and wherein the method further comprises:
  loading the integrated circuit device with the circuit design;
  programming at least one switch to establish an uninterrupted signal path for a selected one of the plurality of probe net routes, thereby enabling the probe point corresponding to the selected probe net route; and
  reprogramming at least one switch to establish an uninterrupted signal path for a different one of the plurality of probe net routes, thereby enabling the probe point corresponding to the different probe net route.

16. A computer program product, comprising:
  a non-transitory computer-usable medium having computer-usable program code that causes a computer to incorporate probe points within a circuit design for implementation within an integrated circuit device, the computer-usable medium comprising:
  computer-usable program code that routes probe nets of the circuit design in an overlap mode;
  computer-usable program code that identifies a plurality of probe net routes comprising a common overlapping portion;
  computer-usable program code that includes a switch at each location within the circuit design where at least two probe net routes of the plurality of probe net routes diverge from a common point; and
  computer-usable program code that outputs the circuit design.

17. The computer program product of claim 16, wherein:
  each probe net route comprises a probe point as an endpoint, and
  the computer-usable medium further comprises computer-usable program code that configures at least one switch to establish an uninterrupted signal path for a selected one of the plurality of probe net routes, thereby enabling the probe point of the selected probe net route.

18. The computer program product of claim 16, wherein the computer-usable medium further comprises at least one of computer-usable program code that selects a type of switch for inclusion in the circuit design according to a timing requirement of the plurality of probe net routes or computer-usable program code that selects a type of switch for inclusion in the circuit design according to a switching requirement of the plurality of probe net routes.

19. The computer program product of claim 16, wherein the computer-usable medium further comprises:
  computer-usable program code that distinguishes between probe nets and circuit nets of the circuit design;
  computer-usable program code that routes the circuit nets forming circuit net routes with overlap permitted; and computer-usable program code that removes all instances of overlap from the circuit net routes, wherein overlap remains within the probe net routes.

20. The computer program product of claim 16, wherein each probe net route corresponds to one of the probe points, and wherein the computer-usable medium further comprises:

computer-usable program code that loads the integrated circuit device with the circuit design; and computer-usable program code that selectively enables different probe points of the plurality of probe net routes by reprogramming at least one switch to establish an uninterrupted signal path for a selected one of the plurality of probe net routes, thereby enabling the probe point corresponding to the selected probe net route.

* * * * *